(12) United States Patent
Nutzel et al.

(10) Patent No.: US 8,912,526 B2
(45) Date of Patent: Dec. 16, 2014

(54) ELECTRON MULTIPLIER DEVICE HAVING A NANODIAMOND LAYER

(75) Inventors: Gert Nutzel, Delft (NL); Pascal Lavoute, Brive la Gaillarde (FR); Richard B. Jackman, Hertfordshire (GB)

(73) Assignee: Photonis France, Brive (FR)

( * ) Notice: Subject to any disclaimer, the term of this patent is extended or adjusted under 35 U.S.C. 154(b) by 99 days.

(21) Appl. No.: 13/823,018

(22) PCT Filed: Sep. 9, 2011

(86) PCT No.: PCT/EP2011/065674
§ 371 (c)(1),
(2), (4) Date: May 31, 2013

(87) PCT Pub. No.: WO2012/034948
PCT Pub. Date: Mar. 22, 2012

(65) Prior Publication Data
US 2013/0240907 A1 Sep. 19, 2013

(30) Foreign Application Priority Data
Sep. 13, 2010 (FR) .................................... 10 57276

(51) Int. Cl.
*H01L 29/06* (2006.01)
*H01L 31/18* (2006.01)
*H01L 31/028* (2006.01)
*G01T 1/28* (2006.01)
*H01J 1/32* (2006.01)
*H01J 43/18* (2006.01)
*H01J 43/24* (2006.01)
*H01J 9/12* (2006.01)
*B82Y 30/00* (2011.01)
*B82Y 15/00* (2011.01)

(52) U.S. Cl.
CPC .......... *H01L 31/028* (2013.01); *H01L 31/1804* (2013.01); *Y10S 977/755* (2013.01); *B82Y 15/00* (2013.01); *G01T 1/28* (2013.01); *H01J 1/32* (2013.01); *H01J 43/18* (2013.01); *H01J 43/246* (2013.01); *H01J 9/125* (2013.01); *B82Y 30/00* (2013.01)
USPC ................ 257/10; 438/20; 313/309; 977/755

(58) Field of Classification Search
CPC ............. H01J 1/34; H01J 9/12; H01J 43/246; H01J 2237/24435; H01J 31/507
USPC ................................ 257/10; 438/20; 313/309
See application file for complete search history.

(56) References Cited

U.S. PATENT DOCUMENTS

| 5,680,008 A | 10/1997 | Brandes |
| 2008/0073127 A1 | 3/2008 | Zhan et al. |

(Continued)

FOREIGN PATENT DOCUMENTS

EP   0 908 917 A2   4/1999

OTHER PUBLICATIONS

Fox et al. "Properties of electron field emitters prepared by selected area deposition of CVD diamond carbon films." Diamond and Related Materials, Elsevier Science Publishers, Amsterdam, NL. vol. 9, No. 3-6, Apr. 1, 2000.

(Continued)

*Primary Examiner* — Minh-Loan Tran
(74) *Attorney, Agent, or Firm* — Knobbe Martens Olson & Bear LLP

(57) ABSTRACT

An electron multiplier for a system for detecting electromagnetic radiation or an ion flow is disclosed. The multiplier includes at least one active structure intended to receive a flow of incident electrons, and to emit in response a flow of electrons called secondary electrons. The active structure includes a substrate on which is positioned a thin nanodiamond layer formed from diamond particles the average size of which is less than or equal to about 100 nm.

17 Claims, 4 Drawing Sheets

(56) References Cited

U.S. PATENT DOCUMENTS

2009/0212680 A1 8/2009 Tremsin et al.
2009/0315443 A1 12/2009 Sullivan
2010/0025796 A1* 2/2010 Dabiran .................. 257/436

OTHER PUBLICATIONS

Lapington Jon et al. "Detectors: Diamond dynodes create new breed of photon detectors." Laser Focus World. Aug. 23, 2008. http://www.laserfocusworld.com/display_article/336816/12/none/none/WebX/detectors:-diamond-dynodes-create-new-breed-of-photon-detector. Internet date May 23, 2011.

Li C C et al. "Preparation of clear colloidal solutions of detonation nanodiamond in organic solvents." Colloids and Surfaces. A, Physicachemical and Engineering Aspects. Elsevier, Amsterdam, NL. vol. 53, No. 1. Jan. 5, 2010. pp. 52-56.

Wernick & Aarsvold, 2004, *Emission tomography: the fundamentals of PET and SPECT*, Academic Press Inc.

Williams et al., *Enhanced diamond nucleation on monodispersed nanocrystalline diamond*, 2007, Chem. Phys. Lett., 445, 255-258.

Williams et al., *Growth, electronic properties and applications of nanodiamond*, 2008, Diam. Relat. Mater., 17, 1080-1088.

\* cited by examiner

ELECTRON MULTIPLIER DEVICE HAVING A NANODIAMOND LAYER

RELATED APPLICATIONS

This application is a U.S. National Phase of International Application No. PCT/EP2011/065674, filed Sep. 9, 2011, which claims the benefit of French Patent Application No. 1057276 filed Sep. 13, 2010, each of which is incorporated by reference in their entirety.

TECHNICAL FIELD

The present invention relates to the general field of reflection-mode electron multipliers present in electromagnetic radiation or ion flow detection tubes.

The electron multiplier device according to the invention is called a "reflection-mode" device in that it includes a single face through which it receives a flow of electrons called "incident" electrons, and emits in response a flow of electrons called "secondary" electrons. It is distinguished in this regard from transmission electron multipliers, for which the reception face and the emission face are separate from one another.

As an illustration, such a reflection-mode electron multiplier device may be a microchannel wafer or an assembly of dynodes, arranged in a photomultiplier tube, an image intensifier tube, or an ion detection tube.

BACKGROUND

Electromagnetic radiation or ion flow detection tubes, such as photomultiplier tubes, image intensifier tubes and ion detection tubes, habitually include an input device to receive the electromagnetic radiation or the ion flow, and to emit in response a flow of electrons called primary electrons, an electron multiplier device to receive the said flow of primary electrons and to emit in response a flow of electrons called secondary electrons, and also an output device to receive the said flow of secondary electrons and to emit in response an output signal.

The electron multiplier includes at least one active structure intended to receive a flow of incident electrons, and to emit in response a flow of electrons called secondary electrons.

It may be of the reflection-mode electron multiplier type, where the active structure then has a single face for emission and reception of electrons. It may be formed, for example, from a microchannel wafer (GMC) or an assembly of dynodes.

The GMC is a high-gain electron multiplier which habitually takes the form of a fine plate, including a network of microchannels which traverse it from an upstream face facing towards the input device to an opposite downstream face facing towards the output device.

Two electrodes are present, one positioned on the upstream face of the GMC, the other on the downstream face. The GMC is thus subject to a difference of potential between its two faces, causing an electric field to be generated.

As is shown in FIG. 1A, which is a schematic and partial view of a microchannel 12 of a GMC, when a primary electron enters into a microchannel 12 and strikes its inner wall 14, secondary electrons are generated which, when they in their turn strike wall 14, generate further secondary electrons. The electrons are directed and accelerated by the electric field towards output aperture 13B of microchannel 12 located in downstream face 11B of the GMC.

The GMC's active structure thus essentially includes the substrate forming the said plate, where the substrate is made from lead glass. A lead reduction treatment is applied to optimise the secondary emission rate, and to make the inner wall of each microchannel semiconducting. The inner wall of each microchannel is then electrically connected to an external voltage source, which enables each microchannel to be supplied with the electrons intended to be emitted.

The GMC has a global gain G which depends on the elementary gain $\delta_i$, or local secondary emission rate, at each step i of multiplication, and on multiplication number n in each microchannel, according to the following relationship:

$$G = \prod_{i}^{n} \delta_i \quad (1)$$

In addition, the GMC has a signal-to-noise ratio which depends on noise factor F as $F^{-1/2}$. And noise factor F also depends on elementary gain $\delta_i$ and on step number n of multiplication in each channel, as expressed by the following relationship:

$$F = 1 + \frac{1}{\delta_1} + \frac{1}{\delta_1 \delta_2} + \frac{1}{\delta_1 \delta_2 \delta_3} \ldots + \frac{1}{\delta_1 \delta_2 \ldots \delta_n} \quad (2)$$

where $\delta_1 \sim 3\text{-}5$ and $\delta_{i>1} \sim 2$.

Increasing global gain G of the GMC may thus consist in increasing the length of each microchannel to increase the number of multiplication steps. However, as shown by relationship (2), this causes, de facto, an increase of noise factor F, and therefore a reduction of the signal-to-noise ratio. Increasing the GMC's global gain is thus accompanied by a degradation of the quality of the signal.

Another possibility to increase the GMC's global gain without degrading the signal-to-noise ratio may consist in using the known technique of chemical vapour deposition (CVD) to deposit a thin film of a material with a high secondary emission rate on the inner wall of the microchannels of the GMC. However, this would require that the substrate of the GMC is subjected to a temperature of over 800° C. over long periods, which is inconceivable given that the GMC's lead glass substrate cannot be subjected to higher than 430° C. without incurring a degradation of its structure and therefore of its performance.

Alternatively to the GMC, a reflection-mode electron multiplier device may be formed from an assembly of dynodes 2-1, 2-2, 2-3, etc., the configuration of which may be, in a known manner, of the venetian blind, box, linear focusing, circular cage, mesh, or foil type. A representation of these different categories of dynodes may be found in the work of Wernick & Aarsvold, 2004, *Emission tomography: the fundamentals of PET and SPECT*, Academic Press Inc.

The multiplier device has a global gain G which is written according to the same relationship as for a GMC, where $\delta_i$ is then the elementary gain of multiplication step i, in this case dynode i, and of the number n of dynodes.

The assembly of dynodes also has a rise time which depends directly on the elementary gain $\delta_i$ of each dynode and on the number n of dynodes, as expressed by the following relationship:

$$RT \propto \left( \sum_{i}^{n} \sigma_i \right)^{1/2} \quad (3)$$

where $\sigma_i$ is the spread over time of the signal at dynode i. Rise time RT is conventionally defined as the time difference between 10% and 90% of the maximum value of a current pulse at the anode (output device) of the detection system, in response to a light pulse modelled by a delta function.

Increasing global gain G of the assembly of dynodes may thus consist in increasing the number n of dynodes, but causes de facto an increase of the rise time RT. Increasing the global gain of the assembly of dynodes is thus accompanied by a degradation of the multiplier's time resolution.

SUMMARY OF CERTAIN INVENTIVE ASPECTS

A principal aim of the invention is to present a reflection-mode electron multiplier device having a high global gain for a signal-to-noise ratio or a rise time which is unchanged or improved.

To accomplish this, one object of the invention is a reflection-mode electron multiplier device, for an electromagnetic radiation or ion flow detector, including at least one active structure intended to receive a flow of incident electrons, and to emit in response of flow of electrons called secondary electrons.

According to the invention, the said active structure includes a substrate on which is positioned a thin nanodiamond layer formed from diamond particles the average size of which is less than or equal to 100 nm.

The expression "reflection-mode electron multiplier device" means a device the active structure of which has a single face for reception of the flow of incident electrons and for transmission of the flow of secondary electrons. This type of device is thus distinguished from transmission electron multiplication devices, in which the active structure has a first face for reception of the flow of incident electrons, and a second face for emission of the flow of secondary electrons.

The active structure thus includes a thin nanodiamond layer, diamond being a material with a high rate of secondary emission of electrons. It should be noted that the said thin layer is a layer formed from diamond particles. It is therefore called "granular", "particular", or "discrete", and is distinguished from diamond layers forming a physically continuous medium.

The electron multiplier device according to the invention thus indeed has a high global gain since at least one step of multiplication is accomplished by the nanodiamond layer. In addition, the signal-to-noise ratio is improved, or the rise time is unchanged, since it is not necessary to increase the multiplier device's number of steps of multiplication.

The average size of the diamond particles of the said nanodiamond layer is preferably between 1 nm and 10 nm, and is preferably of the order of 5 nm.

The said nanodiamond layer may have a thickness roughly equal to the average size of the diamond particles.

It may also have an average thickness greater than the average size of the diamond particles, and thus be formed from several nanodiamond layers.

The term "single-layer" is understood to mean a layer the average thickness of which is roughly equal to the average size of the diamond particles.

The said nanodiamond layer may have an average thickness of between 1 nm and 100 nm, and preferably between 5 nm and 75 nm, for example of the order of 20 nm or 50 nm.

The said nanodiamond layer preferably has an average thickness of roughly less than 50 nm.

The said nanodiamond layer is in contact with the substrate, where the said substrate is electrically conductive, and is at a predetermined electrical potential.

The said nanodiamond layer may alternatively lie on a sub-layer of an electrically conductive material, where the said sub-layer is in contact with the said substrate, and where the said substrate is electrically insulating.

The said sub-layer may be made from $Al_2O_3$ and $ZnO$, or $MgO$ and $ZnO$, or any other combination of materials providing high conductivity in the field used for these applications.

According to one embodiment of the invention, the said active structure is a microchannel wafer, in which each of the said microchannels traverses the said substrate from an input aperture for the flow of incident electrons to an output aperture for the flow of secondary electrons, where the said nanodiamond layer extends over the inner surface of each of the said microchannels from the corresponding input aperture.

The said nanodiamond layer advantageously extends over a length of microchannel of between one and thirty times the average diameter of the microchannels.

The said nanodiamond layer may be extended over the inner surface of each of the said microchannels, as far as a distance, relative to the said corresponding output aperture, of between one and ten times the average diameter of the microchannels.

The said nanodiamond layer may alternatively extend over the entire length of the inner surface of each of the said microchannels, down to the corresponding output aperture.

The said substrate of the said microchannel wafer may be made from lead glass.

According to one variant, the said substrate of the said microchannel wafer may be produced from glass, and may have an appreciably zero concentration of lead oxide PbO.

According to another embodiment of the invention, the multiplier device includes multiple active structures, where each active structure is a dynode, and where the structures are positioned relative to one another so as to multiply in succession the flow of incident electrons, and where at least one dynode includes a substrate on one face of which the said nanodiamond layer extends at least partially.

The invention also relates to a system for detecting an electromagnetic radiation or ion flow, including:
  an input device, to receive the electronic radiation or ion flow, and to emit in response a flow of electrons called primary electrons,
  a reflection-mode electron multiplier device with any of the previous characteristics, to receive the said flow of primary electrons and to emit in response a flow of electrons called secondary electrons, and
  an output device, to receive the said flow of secondary electrons, and to emit an output signal in response.

The said nanodiamond layer is advantageously positioned such that it receives the said flow of primary electrons.

The detection system may be a photomultiplier tube, an image-intensifier tube, or an ion flow detection tube.

Finally, the invention relates to a method for producing an electron multiplier device with any of the previous characteristics, including a step of formation of the nanodiamond layer on the said substrate, where the said step involves the said substrate being brought at least partially into contact with a colloidal solution containing diamond particles the average size of which is less than or equal to 100 nm, in an ultrasonic bath, for a predetermined period.

The diamond particles preferably have an average size of less than or equal to 10 nm, where the said step of an ultrasonic bath is preceded by a step of lamination of the diamond particles by means of zirconium-based lamination elements.

The diamond particles are preferably obtained beforehand by detonation.

Other advantages and characteristics of the invention will appear in the non-restrictive detailed disclosure below.

BRIEF DESCRIPTION OF THE DRAWINGS

Embodiments of the invention will now be described, as non-restrictive examples, with reference to the appended illustrations, in which.

Previously described

Previously described

DETAILED DESCRIPTION OF CERTAIN ILLUSTRATIVE EMBODIMENTS

Figure 1A:
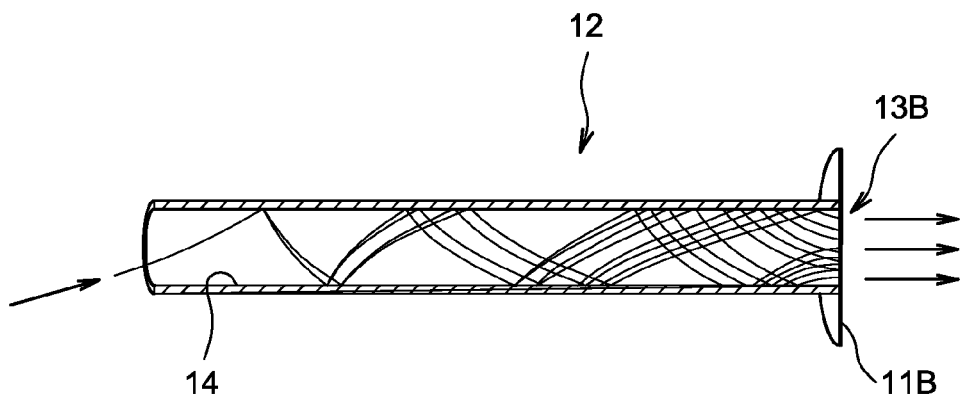
FIG. 1A is a schematic lengthways section view of a microchannel of a microchannel wafer according to the prior art.
Figure 1B:
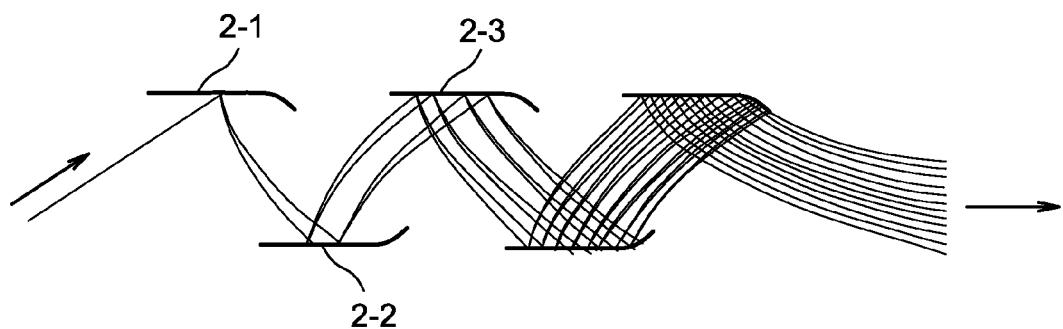
FIG. 1B is a schematic lengthways section view of an assembly of dynodes of the linear focusing type according to the prior art.
Figure 2:
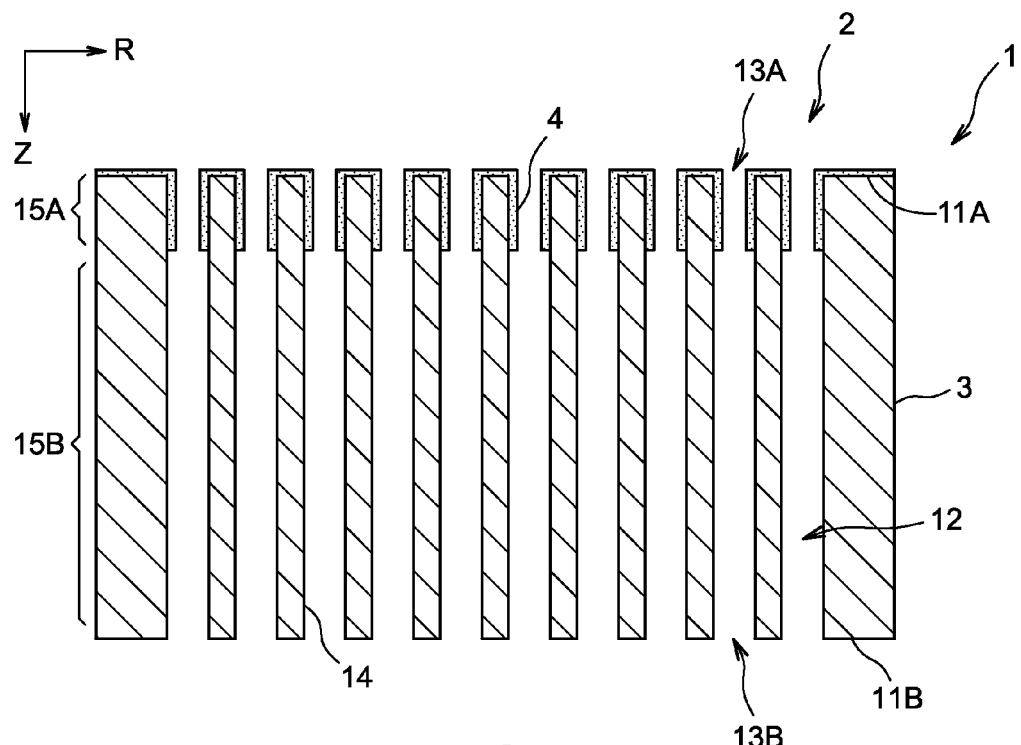
FIG. 2 is a schematic lengthways section view of an electron multiplier device including a microchannel wafer according to the first embodiment of the invention.

FIG. 2 partially and schematically illustrates an electron multiplier device 1 according to the first embodiment of the invention, essentially comprising a microchannel wafer 2 (GMC).

This multiplier 1 may be used in an electromagnetic radiation or ion flow detection system. In this case that it is considered to be positioned in an image intensifier tube, but it may also be used in a photomultiplier tube or in an ion flow detection tube.

It should be noted that the illustration is not to scale, to improve its clarity.

Throughout the following description a coordinate (R,Z) orthonormed in cylindrical coordinates is used, where R is the radial direction of the tube, and Z is the axial direction of the tube, which is also roughly comparable to the general direction of propagation of the electrons.

In addition, the terms "upstream" and "downstream" used below must here be understood in terms of alignment in the Z direction of the (R,Z) coordinate.

The image intensifier tube may have a roughly cylindrical or tubular shape, along axis Z. However, the tube may also be of a shape having a roughly square, rectangular or hexagonal section, or a section of any other shape.

The tube includes three main elements positioned along direction Z, namely an input device (not represented), electron multiplier 1 and an output device (not represented). The tube also includes a tube body (not represented), the function of which is to hold the three elements mentioned above mechanically, to define a sealed chamber, in cooperation with the input and output devices, and to enable the different electrodes present to be powered, in order to impose different electrical fields. The three elements are roughly aligned along tube axis Z.

In the case of an image intensifier tube the input device includes a photocathode which receives the incident photons originating from the external environment, and converts them into photoelectrons with a pattern corresponding to the image of the observed environment. Electron multiplier 1 amplifies the photoelectrons, which are then transformed by the output device into a light signal intensified by means of a phosphorus screen, a CMOS sensor or a CCD sensor, or again a simple anode when no imaging application is involved.

According to the invention, electron multiplier 1 includes an active structure 2 intended to receive a flow of incident electrons, and to emit in response a flow of electrons called secondary electrons. Said active structure 2 includes a substrate 3 on which is provided a thin nanodiamond layer 4 formed of diamond particles the average size of which is less than or equal to 100 nm, and preferentially less than or equal to 10 nm.

In the first embodiment of the invention active structure 2 is a microchannel wafer (GMC).

The GMC is formed from a substrate 3 including a network of microchannels 12 which traverse substrate 3 from its upstream face 11A, facing the input device, as far as its downstream face 11B, facing the output device.

Each microchannel 12 thus has an input aperture 13A for the flow of photoelectrons, positioned in upstream face 11A of GMC 2, and an output aperture 13B for the flow of secondary electrons, positioned in downstream face 11B.

Nanodiamond layer 4 extends roughly continuously over inner surface 14 of each microchannel 12, from input aperture 13A and in the direction of output aperture 13B.

It extends in microchannel 12 over a length of between one and thirty times the average diameter of the microchannels, and preferably between five and ten times their average diameter.

Nanodiamond layer 4 is provided in microchannel 12 such that it implements at least the first step of multiplication of the electrons.

According to this embodiment, nanodiamond layer 4 is in direct contact with inner surface 14 of each microchannel 12.

Downstream from nanodiamond layer 4 in direction Z, inner surface 14 of microchannel 12 is no longer covered by the nanodiamond layer.

Each microchannel 12 therefore has a first upstream area 15A, in which inner surface 14 of microchannel 12 is covered by nanodiamond layer 4, followed, in direction Z, by a second downstream area 15B which has no nanodiamond layer.

It should also be noted that nanodiamond layer 4 is treated with hydrogen, caesium and caesium oxide to reduce its electron affinity. The electrons generated by secondary emission may thus be extracted from it naturally.

Substrate 3 is advantageously made from lead glass, in which the lead has been reduced. Substrate 3 thus has, on inner surface 14 of microchannels 12, an optimised local secondary emission rate, together with sufficient electrical conductivity to allow electrons intended for emission to be supplied.

In addition, inner surface 14 of each microchannel 12 is electrically connected to a single voltage source (not represented) forming a reservoir of electrons for nanodiamond layer 4, firstly, and for second downstream area 15B of inner surface 14 of microchannels 12, secondly.

Inner surface 14 of microchannels 12 of GMC 2 made of lead glass provides, in first upstream area 15A, essentially an electrical function of supplying electrons to nanodiamond layer 4, where the secondary electrons are emitted, in this area, by nanodiamond layer 4.

In addition, in second downstream area 15B, inner surface 14 provides, in addition to supplying electrons intended to be emitted, the additional function of emitting the secondary electrons.

Finally, multiplier 1 includes two polarisation electrodes (not represented), one of which is positioned on upstream face 11A of GMC 2, and the other of which is positioned on downstream face 11B. These two electrodes, which are electrically connected to a voltage source (not represented), enable an electric field intended to direct and accelerate the secondary electrons in the direction of output aperture 13B to be generated inside the GMC.

It should be noted that the voltage source forming the reservoir of electrons may also be the same source as that which generates the electric field, using two polarisation electrodes. The polarisation electrode positioned on the downstream face of the GMC may then electrically connect inner surface 14 of each microchannel 12 to the said voltage source.

As described above, GMC 2 according to the first embodiment of the invention is made principally from silicon oxide ($SiO_2$) and lead oxide (PbO).

Microchannels 12 have an average diameter of the order of, for example, 2 μm to 100 μm, and a length-to-diameter ratio of the order of, for example, 40 to 100.

Nanodiamond layer 4 is formed from diamond particles of average size of less than or equal to 100 nm, preferably between 1 nm and 50 nm, preferably between 5 nm and 10 nm, and preferably of the order of 6 nm.

Nanodiamond layer 4 is said to be particular, or granular, or discrete, and is not therefore physically continuous in the sense of continuous media.

The average thickness of nanodiamond layer 4 is of the order of magnitude of the average size of the diamond particles, such that nanodiamond layer 4 is appreciably single-layer. Its average thickness is roughly between 1 nm and 100 nm, and preferably of the order of 6 nm.

Nanodiamond layer 4 extends along inner surface 14 of microchannels 12 over a length of the order of thirty times the average diameter of microchannels 12, preferably of the order of five to ten times the average diameter, for example 50 μm to 100 μm.

The polarisation electrodes may be made from nickel-chromium, and extend over the upstream face and the downstream face of the GMC. Other materials such as ITO may also be used.

Production of the nanodiamond layer on the GMC is now described in detail, with reference to the articles of Williams et al., one of which is entitled *Enhanced diamond nucleation on monodispersed nanocrystalline diamond,* 2007, Chem. Phys. Lett., 445, 255-258, and the other of which is entitled *Growth, electronic properties and applications of nanodiamond,* 2008, Diam. Relat. Mater., 17, 1080-1088.

First, diamond powder is produced, formed of diamond particles the average size of which is less than or equal to 100 nm, preferably between 1 nm and 10 nm, and advantageously of the order of 6 nm.

For this, the known technique of detonation is used. However, during the cooling cycle of the detonation shockwave, clusters of diamond particles the average size of which is appreciably greater than 100 nm are formed, which make the average particle size distribution heterogeneous.

To make the size distribution of the powder obtained by detonation homogeneous it is milled using zirconium beads. The details of this procedure are described notably in the abovementioned Williams 2007 article.

The blend obtained from this step of milling is then filtered and cleaned by aggressive acid treatments, by this means enabling a stable suspension of nanodiamond particles to be obtained, the size distribution of which is homogeneous. The average size of the nanodiamond particles is of the order of 6 nm, with a size distribution of between approximately 5 nm and 10 nm.

The GMC is then dipped from the upstream face in a colloidal solution of water or ethanol containing the said nanodiamond particle, in an ultrasonic bath, for a predetermined period, for example 30 min.

The nanodiamond particles are then deposited on the inner surface of the microchannels, thus forming the said nanodiamond layer.

The duration of the ultrasonic bath notably enables the length of spread of the nanodiamond layer along the microchannels, from the respective input aperture, to be controlled.

The GMC obtained in this manner is then rinsed in pure deionised water and blow-dried in nitrogen. An electron multiplier including a GMC the active structure of which includes a nanodiamond layer is then obtained.

When a flow of photoelectrons enters microchannels 12 they thus strike nanodiamond layer 4, which in response emits a flow of secondary electrons with an elementary gain $δ_1$. The emitted secondary electrons may then strike nanodiamond layer 4 several times before striking inner surface 14 of microchannels 12 located in second downstream area 15B, or directly strike inner surface 14 of microchannels 12 located in second downstream area 15B. After a number n of multiplication steps, the first of which at least is provided by nanodiamond layer 4, a flow of secondary electrons exits each microchannel 12 through output aperture 13B, in the direction of the phosphorus screen of the image intensifier tube.

The electron multiplier according to the first embodiment of the invention thus has several advantages.

Indeed, since diamond is known to have a high secondary emission efficiency, notably higher than lead glass, the electron multiplier has a particularly high global gain, since at least the first step of multiplication is accomplished by the nanodiamond layer. Elementary gain $δ_1$ in the first multiplication step is, indeed, between 5 and over 60, for example of the order of 5, 10, 20, 30, 40, 50, 60, or more, whereas it is of the order of 3 to 5 in the case of lead glass. In addition, according to relationship (2), the noise factor is reduced, which also increases the signal-to-noise ratio.

Without it being necessary to increase the length of the microchannels, the electron multiplier according to the first embodiment of the invention thus has a high global gain and improves the signal-to-noise ratio relative to the lead glass GMCs of the prior art.

It should be noted that nanodiamond layer 4 may extend, no longer over a short distance from input aperture 13A, as previously described, but along the entire length of microchannel 12 as far as corresponding output aperture 13B.

All steps of multiplication of the incident electrons in microchannels 12 are thus appreciably accomplished by nanodiamond layer 4. The global gain of multiplier 1 is then particularly high and the signal-to-noise ratio is increased.

In the case of the image intensifier tube, with the aim of not degrading spatial resolution, the nanodiamond layer advantageously extends over the length of the microchannel, but stops at a distance of the order of one to ten times the average diameter of the microchannels from the output aperture. In this case, an electron collection layer 17 (represented in FIG. 3) made of a conductive material with an appreciably zero secondary emission rate may be deposited on the inner surface of the microchannel over the said distance of the order of one to ten times the average diameter of the microchannels from the output aperture. The incident electrons striking this collection layer, in this area called the "collection area", are thus absorbed by the said layer, and no secondary electrons are emitted. The multiplier's spatial resolution is thus unchanged.

Figure 3:
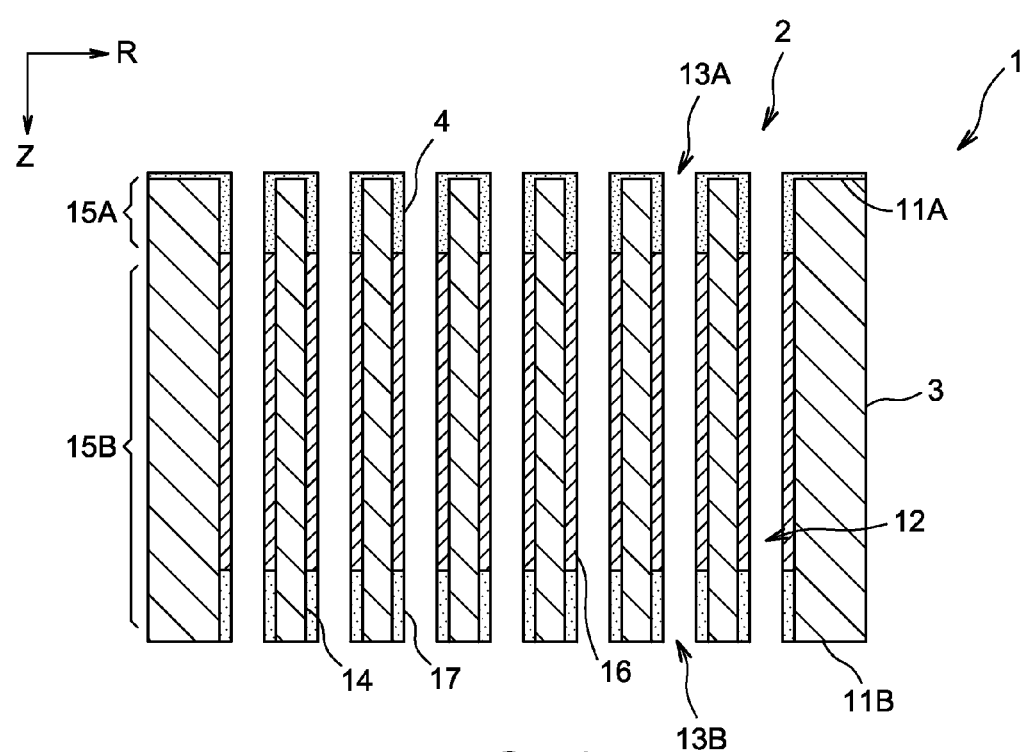
FIG. 3 is a schematic lengthways section view of an electron multiplier device including a microchannel wafer according to a first variant of the first embodiment represented in FIG. 3.

FIG. 3 illustrates a first variant of the previously described first embodiment of the invention.

Numerical references identical to those of previously described FIG. 2 designate identical or similar elements.

This variant differs from the previous embodiment essentially in that inner surface 14 of microchannels 12 in second upstream area 15B is covered with a thin layer 16 of $Al_2O_3$, a material with a high secondary emission rate.

Thin layer 16 of $Al_2O_3$ may have be of the order of 5 nm thick, and may extend along microchannel 12, but in this case it stops at a distance of the order of one to ten times the average diameter of the microchannels from output aperture 13B. As previously mentioned, electron collection layer 17 made of a conductive material with an appreciably zero secondary emission rate may be deposited on inner surface 14 of microchannel 12 over the said distance of the order of one to ten times the average diameter of the microchannels from the output aperture. The spatial resolution of the multiplier, notably in the case of an image intensifier tube, thus remains unchanged.

In the case of a photomultiplier or an ion flow detector, thin layer 16 of $Al_2O_3$ may, on the contrary, extend as far as output aperture 13B of microchannel 12.

It should then be noted that inner surface 14 of microchannel 12 then essentially plays a role of electrical connection between nanodiamond layer 4 and thin layer 16 of $Al_2O_3$, firstly, and the voltage source, secondly, with the aim of allowing the said layers to be supplied with electrons intended to be emitted. Inner surface 14 of microchannel 12 no longer has a role emitting secondary electrons, since nanodiamond layers and layer 16 of $Al_2O_3$ fulfil this function.

Layer 16 of $Al_2O_3$ may be deposited on inner surface 14 of microchannels 12, prior to the formation of nanodiamond layer 4, by the technique known as ALD (Atomic Layer Deposition).

Layer 16 of $Al_2O_3$ may thus be deposited along the entire length of the channel.

The input of the channel is then electroplated with NiCr or ITO from input aperture 13A over a length of two to five times the average diameter of the channel.

Finally, nanodiamond layer 4 is deposited on this conductive layer.

Nanodiamond layer 4 may then be formed, according to the previously described technique, with reference to the first embodiment of the invention.

Figure 4:
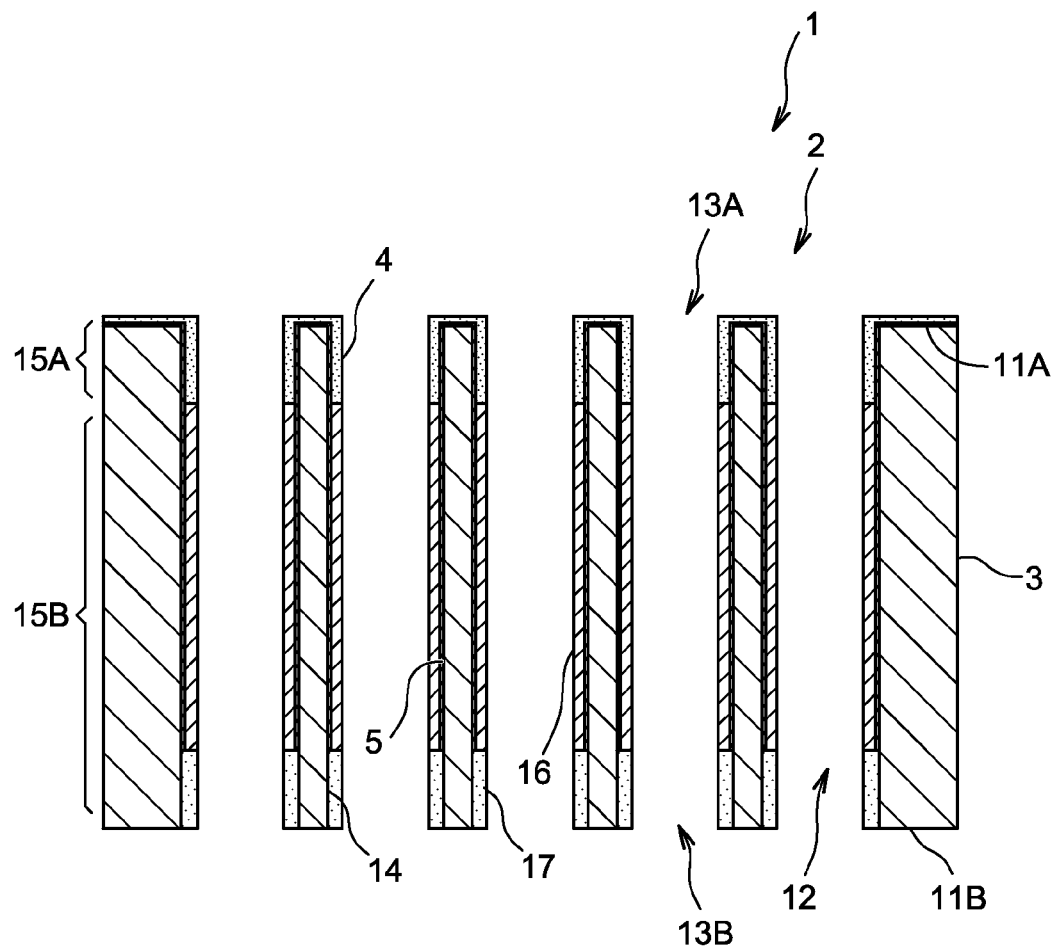
FIG. 4 is a schematic lengthways section view of an electron multiplier device including a microchannel wafer according to a second variant of the first embodiment represented in FIG. 3.

FIG. 4 illustrates a second variant of the previously described first embodiment of the invention.

Numerical references identical to those of previously described FIG. 3 designate identical or similar elements.

The second variant differs from the first variant previously described essentially in that substrate 3 of GMC 2 is made of glass ($SiO_2$) and no longer only of lead glass. The lead oxide (PbO) concentration is therefore appreciably zero.

Thus, inner surface 14 of microchannels 12 no longer has the appropriate electrical property enabling the electrical connection to be made between nanodiamond layer 4 and layer 16 of $Al_2O_3$ with the voltage source.

A sub-layer 5 of an electrically conductive material is then included between nanodiamond layers 4 and layer of $Al_2O_3$ 16 firstly, and inner surface 14 of microchannel 12, secondly. This sub-layer 5 thus makes the electrical connection between nanodiamond layer 4 and layer 16 of $Al_2O_3$ with the voltage source, with the aim of providing the said layers with the electrons intended to be emitted.

This sub-layer 5 may be made of $Al_2O_3$ and ZnO, a material habitually called AZO, and may be deposited by the technique known as ALD (Atomic Layer Deposition). It may be of the order of 5 nm to 30 nm thick.

Nanodiamond layer 4 may then be formed, according to the previously described technique, with reference to the first embodiment of the invention.

It should be noted that substrate 3 is made of glass and no longer of lead glass. The step of reduction of the lead is then no longer necessary, which simplifies the method of production of the GMC. In addition, the lifetime of the GMC is increased, since there are no longer any hydrogen atoms, which remain adsorbed at the inner surface of the microchannels in the lead reduction step, and which are likely to be released and to degrade the GMC or the photocathode.

Figure 5:
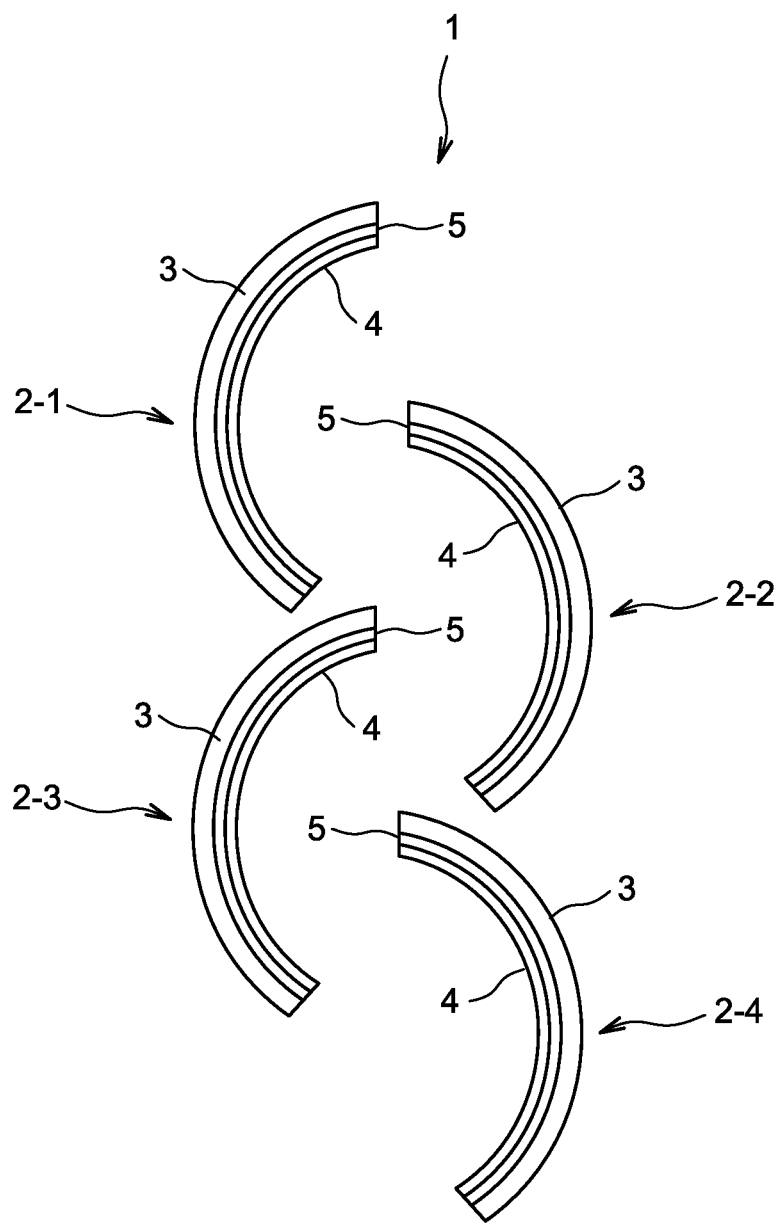
FIG. 5 is a schematic lengthways section view of an electron multiplier device including an assembly of dynodes according to the second embodiment of the invention.

FIG. 5 illustrates partially and schematically a second embodiment of the invention, in which multiplier device 1 includes an assembly of dynodes 2-$i$. Each dynode 2-$i$ thus forms an active structure 2 of the multiplier device.

Numerical references identical to those of previously described FIG. 2 designate identical or similar elements.

This type of electron multiplier 1 is habitually positioned in a photomultiplier or ion flow detector.

In a photomultiplier, the electron multiplier is positioned between an input device including a photocathode and an anode forming an output device.

Assembly of dynodes 2-$i$ represented in FIG. 5 is of the linear focusing configuration; however, other configurations may be used, for example venetian blind, box, circular cage, mesh, or foil configurations.

Each dynode 2-$i$ includes a substrate 3, one face of which is covered with a secondary emission layer.

At least one dynode 2-1, preferably the first one in the direction of travel of the electrons, has a substrate 3, one face of which is covered with nanodiamond layer 4 as presented with reference to the first embodiment of the invention and to its variants.

Dynodes 2-$i$ which do not include said nanodiamond layer 4 may include a metal oxide layer, for example BeO, $Al_2O_3$, or MgO, treated with caesium to reduce their electron affinity, or a layer of a suitable semiconducting material, for example $SbK_2Cs$ or SbRbCs.

All dynodes 2-$i$ preferably include the said nanodiamond layer.

If the substrate is a dielectric material, for example if it is made of ceramic, a sub-layer 5 made of an electrically conductive material is included between the surface of substrate 3 and nanodiamond layer 4. This sub-layer 5 is electrically connected to a voltage source (not represented), thus enabling dynode 2-$i$ to be polarised, and nanodiamond layer 4 to be provided with the electrons intended to be emitted. This sub-layer 5 may be deposited by conventional vacuum deposition techniques, for example by ALD, by sputtering, or by evaporation.

The electron multiplier thus has a particularly high global gain, since at least one dynode, preferably the first dynode, includes the said nanodiamond layer. In addition, according to relationship (3), rise time RT is unchanged, as therefore are the multiplier's time characteristics.

Thus, without it being necessary to increase the number of dynodes, the electron multiplier according to the second embodiment of the invention has a high global gain and a rise time which is unchanged compared to the dynodes of the prior art.

In addition, for an equal gain, the number of dynodes may be reduced, and the rise time RT may be reduced appreciably.

It should be noted that the diamond layer may be obtained and deposited in a manner which is identical or similar to the method described with reference to the first embodiment of the invention.

Various modifications may naturally be made by those skilled in the art to the invention just described, solely as non-restrictive examples.

The electron multiplier may thus be used in all types of photomultipliers, for example the Channeltron.

This type of photomultiplier includes, between the photocathode and the output anode, an electron multiplier device in the form of a single channel, the inner surface of which has a secondary emission property.

The Channeltron according to the invention then has an inner channel surface which is at least partly covered with the nanodiamond layer presented above with reference to the first and second embodiments of the invention, preferably from the input aperture.

The diamond layer may be obtained and deposited in a manner which is identical or similar to the method described with reference to the first embodiment of the invention.

The Channeltron according to the invention then has advantages similar or identical to those described with reference to the first embodiment of the invention.

What is claimed is:

1. A reflection-mode electron multiplier device to detect electromagnetic radiation or ion flows, the device comprising:
   at least one active structure configured to receive a flow of incident electrons and to emit in response a flow of secondary electrons, where the active structure comprises a substrate and a thin nanodiamond layer on the substrate, the nanodiamond layer being formed of diamond particles, the average size of the particles is less than about 100 nm,
   wherein the active structure is a microchannel wafer in which each of a plurality of microchannels traverses the substrate from an input aperture for the flow of incident electrons to an output aperture for the flow of the secondary electrons, where the nanodiamond layer extends over the inner surface of each of the microchannels from the corresponding input aperture.

2. An electron multiplier device according to claim 1, wherein the nanodiamond layer extends over an length of a microchannel of between one and thirty times the average diameter of the microchannels.

3. An electron multiplier device according to claim 1, wherein the nanodiamond layer extends over an inner surface of each of the microchannels for as far as a distance, relative to the corresponding output aperture, of between one and ten times the average diameter of the microchannels.

4. An electron multiplier device according to claim 1, wherein the nanodiamond layer extends over the entire length of an inner surface of each of the microchannels, for as far as the corresponding output aperture.

5. An electron multiplier device according to claim 1, wherein the average size of the diamond particles of the nanodiamond layer is between about 1 nm and 10 nm.

6. An electron multiplier device according to claim 1, wherein the nanodiamond layer has an average thickness of substantially less than about 50 nm.

7. An electron multiplier device according to claim 1, wherein the nanodiamond layer is in contact with the substrate, wherein the substrate is electrically conductive and is at a predetermined electric potential.

8. An electron multiplier device according to claim 7, wherein the substrate of the microchannel wafer is made from lead glass.

9. An electron multiplier device according to claim 1, wherein the nanodiamond layer is lying on a sub-layer of an electrically conductive material, where the sub-layer is in contact with the substrate, and where the substrate is electrically insulating.

10. An electron multiplier device according to claim 9, wherein the sub-layer is made of $Al_2O_3$ and $ZnO$, or $MgO$ and $ZnO$.

11. An electron multiplier device according to claim 9, wherein the substrate of the microchannel wafer is made from lead glass and has a substantially zero lead oxide PbO concentration.

12. A system for detecting electromagnetic radiation or an ion flow, the system comprises:
    an input device configured to receive the electronic radiation or ion flow and to emit in response a flow of primary electrons;
    a reflection-mode electron multiplier device according to claim 1, being configured to receive the flow of primary electrons and to emit in response a flow of the secondary electrons; and
    an output device configured to receive the flow of the secondary electrons, and to emit an output signal in response.

13. A detection system according to claim 12, wherein the nanodiamond layer is positioned so as to receive the flow of the primary electrons.

14. A detection system according to claim 12, wherein the detection system is a photomultiplier tube, an image intensifier tube, or a tube for detecting an ion flow.

15. A method of producing a reflection-mode electron multiplier device to detect electromagnetic radiation or an ion flow, the device comprising at least one active structure configured to receive a flow of incident electrons and to emit in response a flow of secondary electrons, where the active structure comprises a substrate, the method comprising:
    forming a single nanodiamond layer on the substrate, where the process of forming the single nanodiamond layer comprising bringing the substrate at least partially into contact with a colloidal solution containing the diamond particles, the average size of which is less than about 100 nm, in an ultrasonic bath, for a predetermined period.

16. A method of producing an electron multiplier device according to claim 15, wherein the diamond particles have an average size of less than or equal to about 10 nm, where the ultrasonic bath process is preceded by a process of lamination of the diamond particles by zirconium-based lamination elements.

17. A method of producing an electron multiplier device according to claim 16, wherein the diamond particles are previously obtained by detonation.

* * * * *